US009313902B2

(12) United States Patent
Johnson (10) Patent No.: US 9,313,902 B2
(45) Date of Patent: Apr. 12, 2016

(54) CONDUCTIVE STRUCTURES FOR MICROFEATURE DEVICES AND METHODS FOR FABRICATING MICROFEATURE DEVICES

(75) Inventor: Mark S. Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/538,891

(22) Filed: Jun. 29, 2012

(65) Prior Publication Data

US 2012/0302054 A1 Nov. 29, 2012

Related U.S. Application Data

(60) Continuation of application No. 12/613,413, filed on Nov. 5, 2009, now Pat. No. 8,222,727, which is a division of application No. 10/922,184, filed on Aug. 19, 2004, now Pat. No. 7,632,747.

(51) Int. Cl.
| | |
|---|---|
| *H01L 21/44* | (2006.01) |
| *H05K 3/42* | (2006.01) |
| *H01L 21/48* | (2006.01) |
| *H05K 1/02* | (2006.01) |

(Continued)

(52) U.S. Cl.
CPC ............ *H05K 3/428* (2013.01); *H01L 21/4857* (2013.01); *H05K 1/0287* (2013.01); *H01L 23/49827* (2013.01); *H01L 2224/16225* (2013.01); *H01L 2224/16227* (2013.01); *H05K 3/108* (2013.01); *H05K 2201/09609* (2013.01); *H05K 2201/10378* (2013.01)

(58) Field of Classification Search
CPC ... H01L 21/768; H01L 21/027; H01L 21/033; H01L 21/3213; H01L 21/76802; H01L 21/76805; H01L 21/4857; H01L 21/486; H01L 23/49811; H01L 2224/16227; H01L 2224/97; H01L 2224/73265; H01L 2224/73204; H01L 25/0657; H01L 2224/16145; H01L 2225/06513; H01L 2224/81; H01L 23/49827; H01L 2225/06517; H01L 23/3128; H01L 2224/12105; H01L 24/17; H01L 24/13; H01L 2924/18161; H01L 21/76898; H01L 2224/04105; H01L 2224/13024
USPC ......... 438/121, 666, 665, 675, 598, 667, 672; 257/698, 774, E21.575, E21.597, 257/E21.585, E23.141, E23.145, E23.146
See application file for complete search history.

(56) References Cited

U.S. PATENT DOCUMENTS

| | | | |
|---|---|---|---|
| 5,128,831 | A | 7/1992 | Fox, III et al. |
| 5,145,099 | A | 9/1992 | Wood et al. |
| 5,407,864 | A | 4/1995 | Kim |

(Continued)

*Primary Examiner* — Khiem D Nguyen
(74) *Attorney, Agent, or Firm* — Perkins Coie LLP (57) ABSTRACT

Methods for fabricating conductive structures on and/or in interposing devices and microfeature devices that are formed using such methods are disclosed herein. In one embodiment, a method for fabricating interposer devices having substrates includes forming a plurality of conductive sections on a first substrate in a first pattern. The method continues by forming a plurality of conductive sections on a second substrate in a second pattern. The method further includes constructing a plurality of conductive lines in a common third pattern on both the first substrate and the second substrate. The conductive lines can be formed on the first and second substrates either before or after forming the first pattern of conductive sections on the first substrate and/or forming the second pattern of conductive sections on the second substrate.

20 Claims, 10 Drawing Sheets

(51) Int. Cl.
*H01L 23/498* (2006.01)
*H05K 3/10* (2006.01)

(56) References Cited

U.S. PATENT DOCUMENTS

| | | | |
|---|---|---|---|
| 5,593,927 A | 1/1997 | Farnworth et al. | |
| 5,677,566 A | 10/1997 | King et al. | |
| 5,723,904 A | 3/1998 | Shiga | |
| 5,826,628 A | 10/1998 | Hamilton | |
| 5,891,797 A | 4/1999 | Farrar | |
| 5,904,499 A | 5/1999 | Pace | |
| 5,946,553 A | 8/1999 | Wood et al. | |
| 5,981,314 A * | 11/1999 | Glenn et al. | 438/127 |
| 5,986,209 A | 11/1999 | Tandy | |
| 5,990,566 A | 11/1999 | Farnworth et al. | |
| RE36,469 E | 12/1999 | Wood et al. | |
| 6,018,249 A | 1/2000 | Akram et al. | |
| 6,020,624 A | 2/2000 | Wood et al. | |
| 6,072,233 A | 6/2000 | Corisis et al. | |
| 6,089,920 A | 7/2000 | Farnworth et al. | |
| 6,097,087 A | 8/2000 | Farnworth et al. | |
| 6,103,547 A | 8/2000 | Corisis et al. | |
| 6,107,122 A | 8/2000 | Wood et al. | |
| 6,107,679 A | 8/2000 | Noguchi | |
| 6,130,474 A | 10/2000 | Corisis | |
| 6,133,622 A | 10/2000 | Corisis et al. | |
| 6,148,509 A | 11/2000 | Schoenfeld et al. | |
| 6,150,710 A | 11/2000 | Corisis | |
| 6,150,717 A | 11/2000 | Wood et al. | |
| 6,153,924 A | 11/2000 | Kinsman | |
| 6,159,764 A | 12/2000 | Kinsman et al. | |
| 6,188,232 B1 | 2/2001 | Akram et al. | |
| 6,201,304 B1 | 3/2001 | Moden | |
| 6,214,716 B1 | 4/2001 | Akram | |
| 6,222,136 B1 | 4/2001 | Appelt et al. | |
| 6,225,689 B1 | 5/2001 | Moden et al. | |
| 6,228,548 B1 | 5/2001 | King et al. | |
| 6,228,676 B1 | 5/2001 | Glenn et al. | |
| 6,229,202 B1 | 5/2001 | Corisis | |
| 6,232,666 B1 | 5/2001 | Corisis et al. | |
| 6,239,489 B1 | 5/2001 | Jiang | |
| 6,246,108 B1 | 6/2001 | Corisis et al. | |
| 6,247,629 B1 | 6/2001 | Jacobson et al. | |
| 6,258,623 B1 | 7/2001 | Moden et al. | |
| 6,265,766 B1 | 7/2001 | Moden | |
| 6,271,580 B1 | 8/2001 | Corisis | |
| 6,281,042 B1 | 8/2001 | Ahn et al. | |
| 6,285,204 B1 | 9/2001 | Farnworth | |
| 6,291,894 B1 | 9/2001 | Farnworth et al. | |
| 6,326,698 B1 | 12/2001 | Akram | |
| 6,329,222 B1 | 12/2001 | Corisis et al. | |
| 6,331,221 B1 | 12/2001 | Cobbley | |
| 6,344,976 B1 | 2/2002 | Schoenfeld et al. | |
| 6,377,464 B1 | 4/2002 | Hashemi et al. | |
| 6,437,586 B1 | 8/2002 | Robinson | |
| 6,483,044 B1 | 11/2002 | Ahmad | |
| 6,614,092 B2 | 9/2003 | Eldridge et al. | |
| 6,833,512 B2 | 12/2004 | Liu | |
| 6,885,561 B1 * | 4/2005 | Hashemi et al. | 361/760 |
| 6,946,727 B2 | 9/2005 | Ho et al. | |
| 7,095,620 B2 * | 8/2006 | Bozso et al. | 361/767 |
| 7,632,747 B2 * | 12/2009 | Johnson | 438/598 |
| 2002/0020898 A1 | 2/2002 | Vu et al. | |
| 2002/0039808 A1 * | 4/2002 | Fukutomi et al. | 438/106 |
| 2003/0043556 A1 * | 3/2003 | Sugimoto et al. | 361/760 |
| 2003/0136582 A1 * | 7/2003 | Liu | 174/262 |
| 2003/0164540 A1 * | 9/2003 | Lee et al. | 257/686 |
| 2003/0227094 A1 * | 12/2003 | Chou et al. | 257/778 |
| 2004/0235234 A1 * | 11/2004 | Sawada et al. | 438/222 |
| 2005/0073048 A1 * | 4/2005 | Bojkov et al. | 257/737 |
| 2005/0136646 A1 | 6/2005 | Larnerd et al. | |
| 2006/0040428 A1 | 2/2006 | Johnson | |
| 2010/0044876 A1 | 2/2010 | Johnson | |

* cited by examiner

CONDUCTIVE STRUCTURES FOR MICROFEATURE DEVICES AND METHODS FOR FABRICATING MICROFEATURE DEVICES

CROSS-REFERENCE TO RELATED APPLICATIONS

This application is a continuation of U.S. application Ser. No. 12/613,413 filed Nov. 5, 2009, now U.S. Pat. No. 8,222,727, which is a divisional of U.S. application Ser. No. 10/922,184 filed Aug. 19, 2004, now U.S. Pat. No. 7,632,747, each of which is incorporated herein by reference in its entirety.

TECHNICAL FIELD

The present invention is directed to fabricating conductive structures in the manufacturing of microfeature devices and microfeature devices that are formed using such methods.

BACKGROUND

Packaged microelectronic devices, such as memory chips and microprocessor chips, typically include a microelectronic die mounted to a substrate and encased in a plastic protective covering. The die includes functional features, such as memory cells, processor circuits, and interconnecting circuitry. The die also typically includes an array of very small bond-pads electrically coupled to the integrated circuitry. The bond pads are coupled to pins or other types of terminals that extend outside the protective covering for connecting the microelectronic device to buses, circuits and/or or other microelectronic assemblies. The individual dies are typically "packaged" to couple the bond-pads to a larger array of electrical terminals that can be more easily coupled to various external devices.

An individual die can be packaged by electrically coupling the bond-pads on the die to arrays of pins, ball-pads, or other types of electrical terminals, and then encapsulating the die to protect it from environmental factors such as moisture, particulates, static electricity, and physical impact. For example, in one conventional arrangement a packaged device includes an interposer substrate having a front side and a backside. The interposer substrate also includes a plurality of conductive structures on and/or in the substrate. More specifically, a typical interposer substrate includes a plurality of conductive "bumps" or pads at the front side, a plurality of ball-pads at the backside, and a plurality of vias or traces electrically coupling the conductive pads to corresponding ball-pads. A die can be positioned at the front side and attached to the interposer substrate. In one application, for example, a die is "flipped" such that an active side of the die with the bond-pads faces downward for attachment to the front side of the substrate. The bond-pads are usually coupled to the corresponding conductive pads such that the die is electrically and mechanically coupled to the substrate.

A significant limiting factor for manufacturing packaged microelectronic devices is forming the conductive structures on and/or in the interposer substrate to which the bond-pads on the die are attached. One approach has been to fabricate interposer substrates with a number of conductive pads corresponding to the specific line count for a particular type of die. More specifically, individual interposer substrates can be manufactured having specific conductive line configurations (e.g., ×4, ×8, ×16, ×32, etc.) for use with particular die configurations. One drawback with this approach, however, is that it is very expensive to manufacture interposer substrates having a single configuration for a specific type of die. The manufacturing process requires tailoring an individual reticle (e.g., a mask) for each separate device configuration. For example, a mask used to fabricate a device with a ×4 line configuration can not be used to fabricate a device with a ×16 line configuration. Accordingly, the mask must be installed on a dedicated machine for fabrication of the interposing devices having that particular line configuration. As such, if several different line configurations are required (e.g., ×4, ×8, ×16) for a particular run of dies, then three separate fabrication processes and/or machines are required to manufacture the various interposing devices. Accordingly, conventional processes for constructing interposer substrates are relatively expensive.

BRIEF DESCRIPTION OF THE DRAWINGS

FIGS. 9-12B are side cross-sectional views illustrating stages of a method for fabricating conductive structures on and/or in an interposing device in accordance with another embodiment of the invention.

DETAILED DESCRIPTION

Overview

The following disclosure describes several embodiments of methods for fabricating conductive structures in and/or on an interposing device and microfeature devices that are formed using such methods. The term "microfeature device" is used throughout to include microelectronic devices, micromechanical devices, data storage elements, read/write components, and other articles of manufacture. For example, microfeature devices include imagers, SIMM, DRAM, flash-memory, ASICs, processors, flip chips, ball-grid array chips, and other types of electronic devices or components. Several embodiments of the invention are shown in FIGS. 1-12B. One skilled in the art will understand that the present invention may have other embodiments in addition to those disclosed below and that such other embodiments of the invention may be practiced with additional features or without several elements of the embodiments shown in FIGS. 1-12B.

One aspect of the invention is directed toward methods for fabricating interposer devices having substrates. An embodiment of one such method includes forming a plurality of conductive sections on a first substrate in a first pattern. The method continues by forming a plurality of conductive sections on a second substrate in a second pattern. The method further includes constructing a plurality of conductive lines in a common third pattern on both the first substrate and the second substrate. The conductive lines can be formed on the first and second substrates either before or after forming the first pattern of conductive sections on the first substrate and/or forming the second pattern of conductive sections on the second substrate.

Another embodiment is directed toward a method for fabricating an interposer device for connection to a microelectronic die. The die includes integrated circuitry and connectors operatively coupled to the integrated circuitry. The connectors are arranged in a first pattern on the die. This embodiment includes forming a conductive layer having a second pattern on and/or in an interposer substrate. The method further includes selectively forming passages through the substrate either before or after forming the conductive layer on and/or in the substrate. The passages can be formed in a third pattern corresponding to a predetermined arrangement of conductive lines on the workpiece. The third pattern is generally similar to the first pattern. The method also includes constructing conductive lines on and/or in the substrate by selectively electrically coupling first conductive sections of the conductive layer at a first side of the substrate to second conductive sections of the conductive layer at a second side of the substrate.

Another aspect of the invention is directed toward an interposer device including a substrate having a first side and a second side opposite the first side. The substrate also includes a plurality of conductive sections arranged in a first predetermined pattern on the substrate. The individual conductive sections include a first section at the first side of the substrate and a second section at the second side of the substrate. The substrate further includes a plurality of passages selectively formed through the conductive portions in a predetermined second pattern. The second pattern corresponds with a desired arrangement of conductive lines on the substrate. The substrate also includes a plurality of conductive lines arranged in the second pattern on and/or in the substrate. The individual lines include interconnects formed in the passages electrically coupling the first sections to corresponding second sections.

Embodiments of Methods for Fabricating Conductive Structures

FIGS. 1-7 illustrate stages in one embodiment of a method for fabricating conductive structures on and/or in an interposer device. More specifically, FIGS. 1-7 illustrate a method for forming an interposer substrate having a universal arrangement of conductive portions in which conductive elements (e.g., bit lines) can be selectively formed in a predetermined arrangement corresponding to a desired arrangement for a microfeature device.

Figure 1:
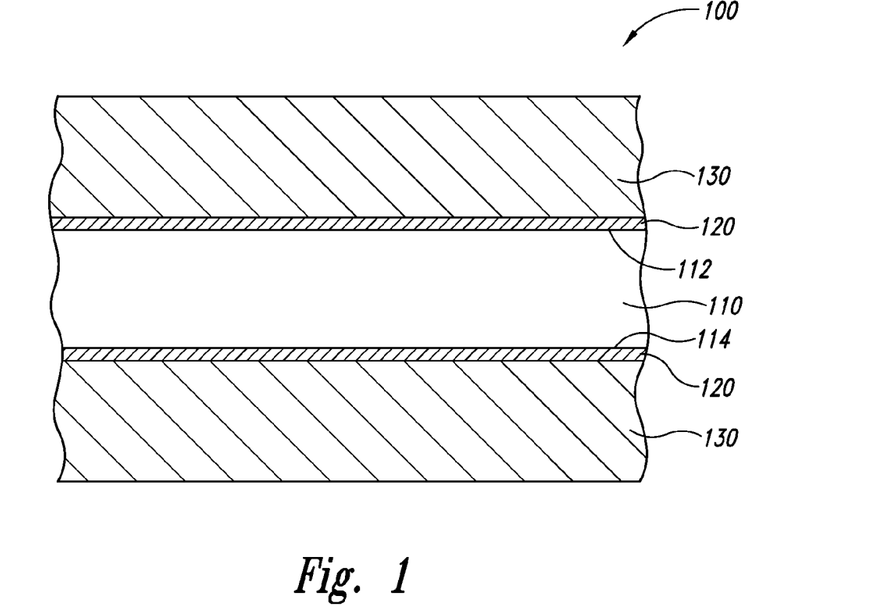
FIGS. 1-7 are side cross-sectional views illustrating stages of a method for fabricating conductive structures on and/or in an interposing device in accordance with an embodiment of the invention.

FIG. 1 is a side cross-sectional view of a workpiece 100 at an initial stage before the conductive portions have been formed. The workpiece 100 can include an interposer substrate 110 having a first side 112 and a second side 114 opposite the first side 112. A seed layer 120 is on both the first side 112 and the second side 114 of the substrate 110. The seed layer 120 can be deposited using vapor deposition techniques, such as chemical vapor deposition, physical vapor deposition, and/or atomic layer deposition. Suitable materials for the seed layer 120 include copper, tungsten, cobalt, aluminum, and other materials used in the semiconductor industry. The workpiece 100 can further include a resist layer 130 deposited over the seed layer 120.

Figure 2:
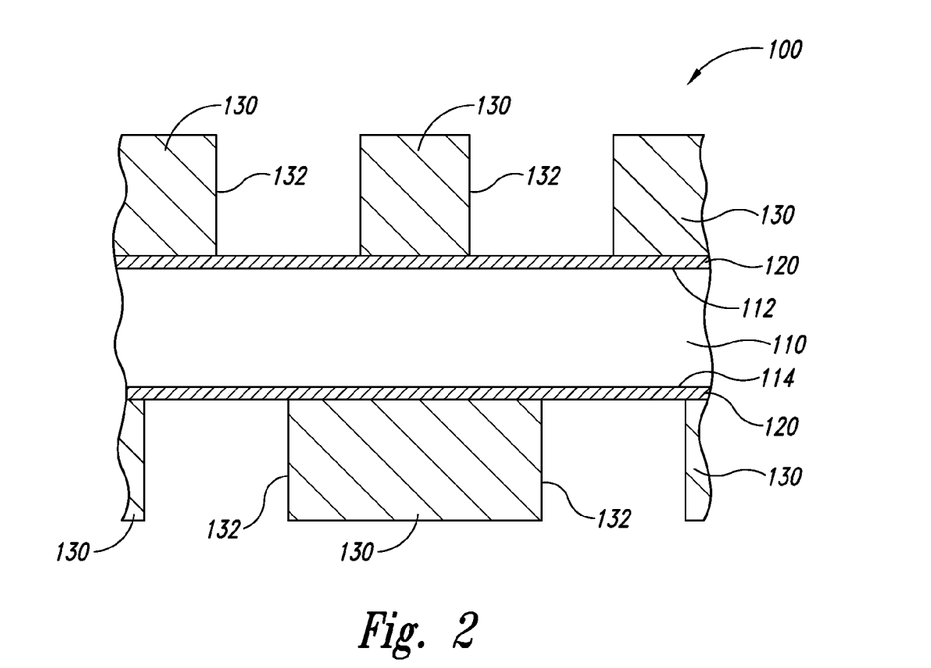

Referring to FIG. 2, the resist layer 130 is patterned to form openings 132 on both the first side 112 and the second side 114 of the substrate 110 corresponding to a desired arrangement of conductive portions on and/or in the workpiece 100. The openings 132 can be a pattern of any number of trenches or holes in the workpiece 100. The openings 132 in the resist layer 130 can be formed by exposing the resist using radiation in a predetermined pattern and then developing the resist to form the openings 132. In other embodiments, the openings 132 can be formed using other suitable processes.

Figure 3:
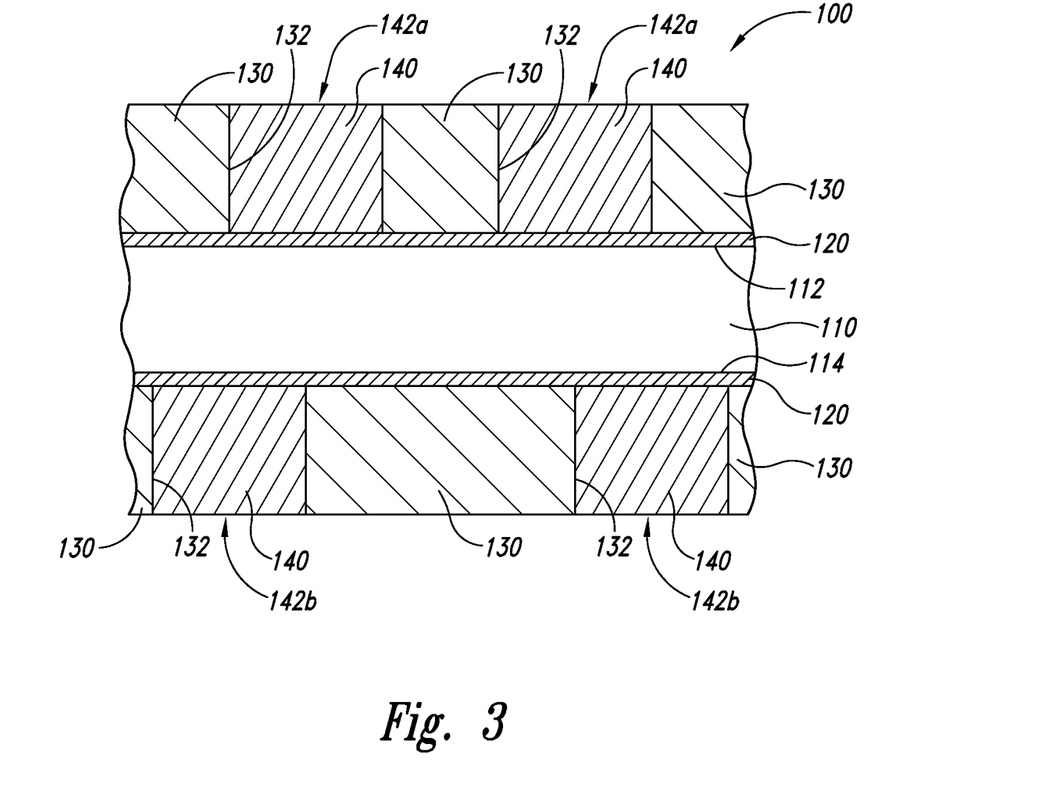

Referring next to FIG. 3, a conductive material 140 is then deposited into the openings 132 on the first side 112 and the second side 114 of the substrate 110. The conductive material 140 in the openings 132 defines conductive sections 142. For example, the conductive material 140 deposited into the openings 132 at the first side 112 of the substrate 110 forms first conductive sections 142a and the conductive material 140 deposited into the openings 132 at the second side 114 of the substrate 110 forms second conductive sections 142b. In the embodiment shown in FIG. 3, the conductive material 140 is plated onto the seed layer 120 using a suitable electrical or electroless plating process, but other suitable processes for filling the openings 132 can be used. The conductive material 140 is generally composed of a metal, such as Cu, but in other embodiments the conductive material 140 can be composed of other suitable materials known to those of skill in the art.

Figure 4:
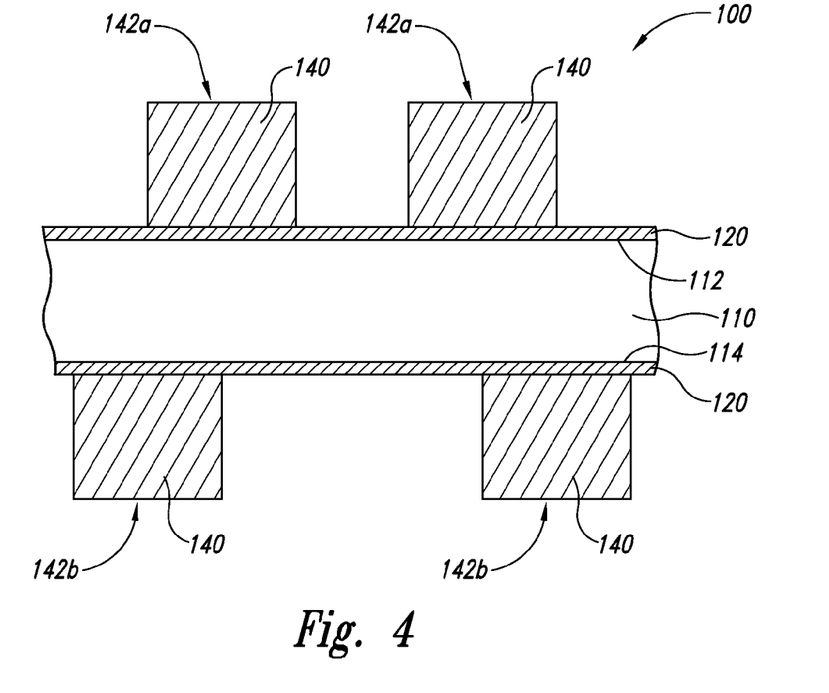

Referring to FIG. 4, the resist layer 130 (FIG. 3) is stripped away from both the first side 112 and the second side 114 of the substrate 110. The resist layer 130 (FIG. 3) is generally removed from the substrate 110 using a washing process, but in other embodiments the resist layer 130 (FIG. 3) may be removed using an isotropic etch and/or another suitable process.

Figure 5:
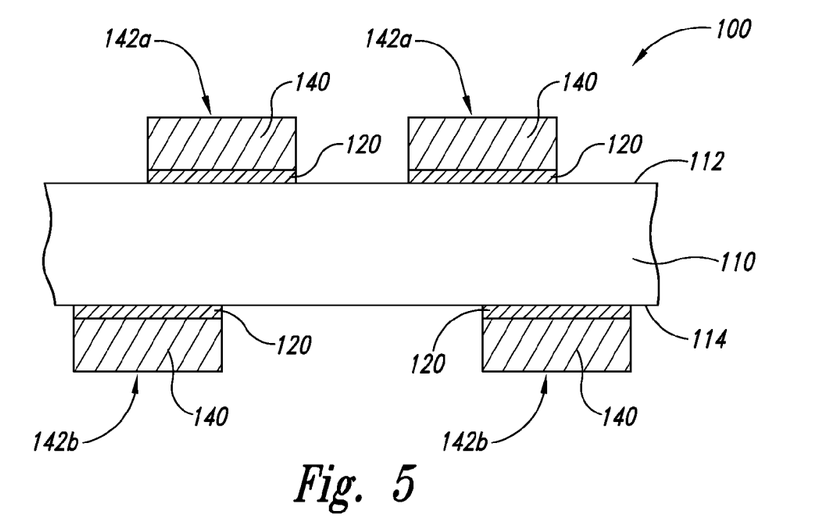

Referring to FIG. 5, the exposed portions of the seed layer 120 on both the first side 112 and the second side 114 of the substrate 110 are selectively removed. The removal process shown in FIG. 5 can also reduce the height of the first and second sections 142a and 142b on the substrate 110 to a final line height. For example, after removal of exposed portions of the seed layer 120 from the substrate 110, the first and second sections 142a and 142b are thinned and the top surfaces of the first and second sections 142a and 142b are substantially flat and uniform across the entire substrate 110. The seed layer 120 can be selectively removed from the workpiece 100 using an etch that is stopped at or slightly before the substrate 110 or another suitable process.

The conductive sections 142a and 142b on the substrate 110 are formed in a universal pattern to accommodate a variety of different configurations of bond-pads on dies. As discussed below, for example, the universal pattern of conductive sections 142 on the substrate 110 can be customized for use with different types of dies by selectively coupling first sections 142a to corresponding second sections 142b in the pattern of a run of dies having a specific configuration.

Figure 6A:
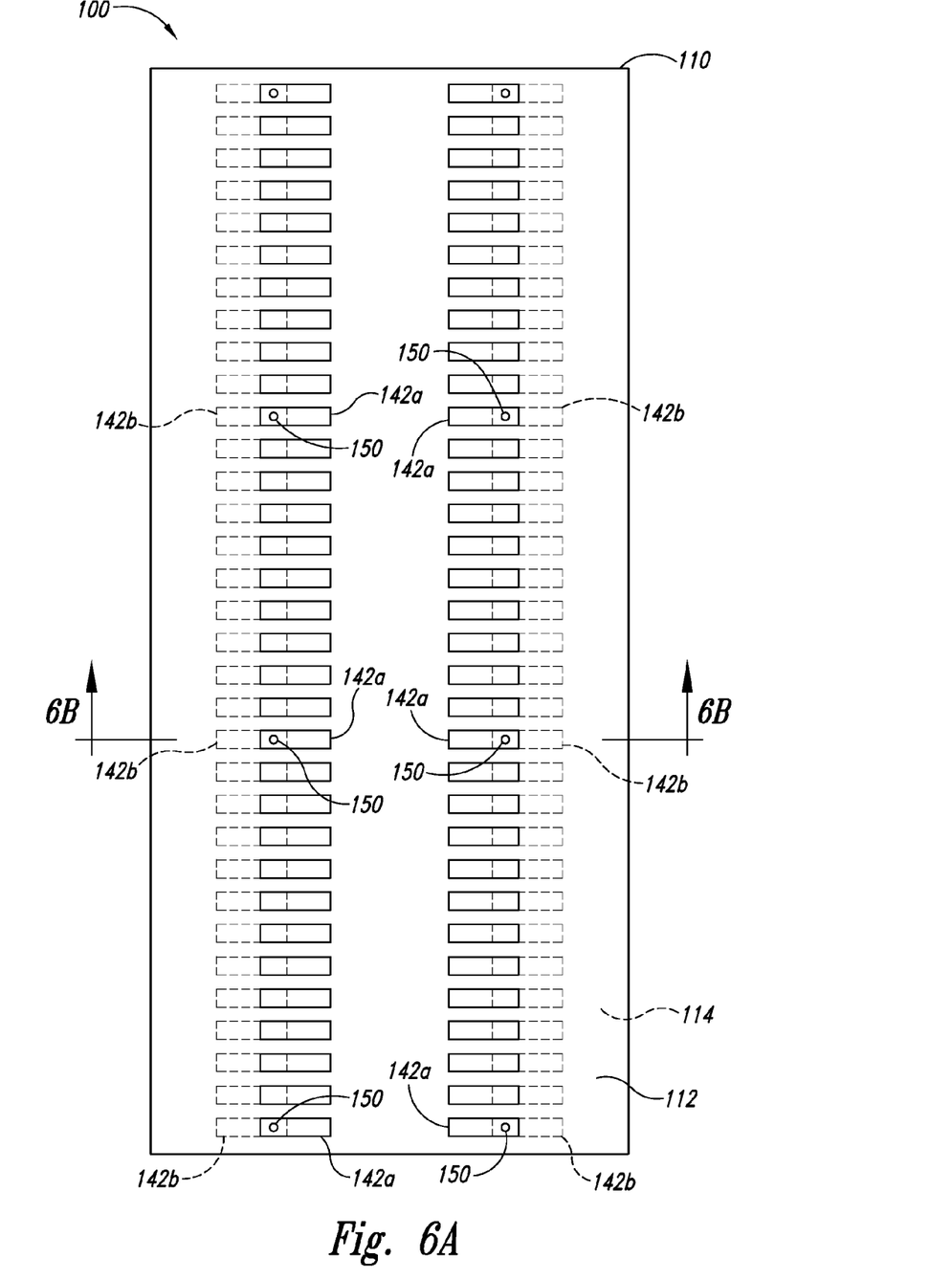
Figure 6B:
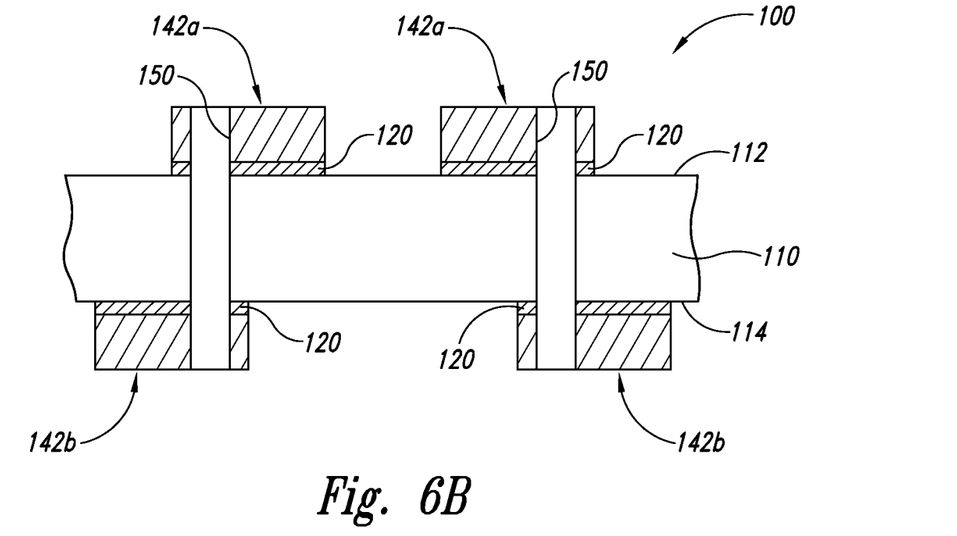

FIG. 6A is a top plan view of the workpiece 100 after selectively forming a plurality of passages 150 through the workpiece 100 to configure the interposer substrate for a specific type of die. For example, the workpiece 100 shown in FIG. 6A includes sixty-six first and second sections 142a and 142b (arranged in two parallel columns having thirty-three sections each). In other embodiments, however, the workpiece 100 may include a different number of first and second sections 142a and 142b and/or the first and second sections 142a and 142b may have a different arrangement on the substrate 110. FIG. 6B is a side cross-sectional view taken substantially along line 6B-6B of FIG. 6A. Referring to FIGS. 6A and 6B together, the passages or vias 150 cut through the workpiece 100 extend completely through the substrate 110 and at least one of the corresponding first sections 142a and second sections 142b (shown in broken lines in FIG. 6A). The passages 150 are selectively formed in a pattern corresponding to the desired arrangement of conductive elements on the workpiece 100. While only eight passages 150 are shown in FIG. 6A, it will be appreciated that any number of passages may formed through the workpiece 100.

The passages 150 can be formed using a mechanical drilling process and/or a laser to cut through the substrate 110 and the first and second sections 142a and 142b. In several embodiments, for example, the passages 150 can be formed using a Computer Numerical Control (CNC) drilling process.

Mechanical drilling processes, however, become more expensive as the size of the passages 150 becomes smaller. Accordingly, the passages 150 can alternatively be formed using a laser. In some embodiments, a laser may be less expensive and more useful to form the passages 150 through the workpiece 100 where the passages 150 are small and have relatively high pitches. In still further embodiments, the passages 150 may be formed using a stamping process or another suitable process.

Figure 7:
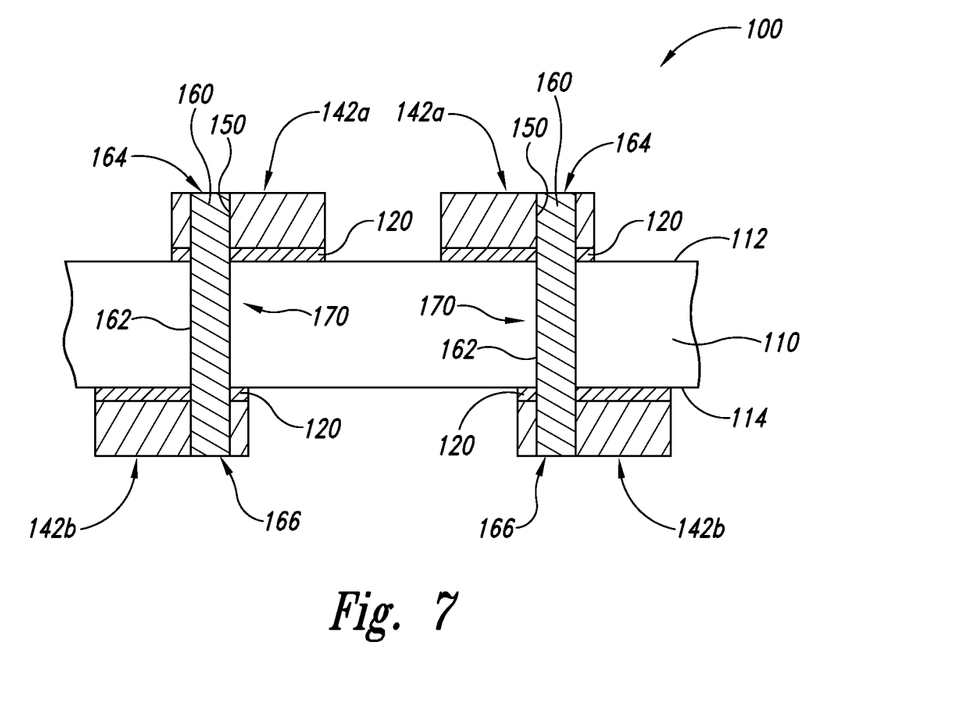

Referring next to FIG. 7, a conductive fill material 160 is deposited into the passages 150 to form interconnects 162 extending through the workpiece 100. The interconnects 162 have a first end 164 contacting the first section 142a and a second end 166 contacting the corresponding second section 142b. The individual first sections 142a, interconnects 162, and second sections 142b together form conductive lines 170 extending through the workpiece 100. The fill material 160 is generally a metal, such as Cu, but in other embodiments the fill material 160 may be composed of other suitable conductive materials. The fill material 160 can be deposited into the passages 150 using electroplating or other suitable methods known to those of skill in the art.

One feature of the method described above is that it is expected to reduce the number of expensive processing steps for manufacturing interposer substrates that redistribute the electrical contacts on a die to a larger array on a module board. In several embodiments of the method described above, for example, a universal interposer has a large number of conductive lines 170 on the workpiece 100 formed using a single pattern/etch process. The number of conductive lines 170 can be selected to accommodate the largest line count of a type of die manufactured by a fabricator. Another feature of the method described above is that the universal interposer substrate can then be configured by selectively drilling holes through only selected first and second conductive sections 142a and 142b in a predetermined pattern matching the line pattern for a specific type of die. Moreover, the conductive material for the conductive sections 142 is provided in a single deposition process. An advantage of these features is that a single photolithographic process step can be used to construct a universal line pattern that can be adapted for use with different dies. Accordingly, several embodiments of the method described above are expected to improve the efficiency and significantly lower the costs of fabricating conductive lines 170 on and/or in the workpiece 100.

More specifically, the method described enables selective configuration of conductive sections 142 on the workpiece 100 to accommodate specific die types. The conventional processes for forming conductive elements (e.g., bit lines) on a workpiece require a separate mask and a separate process for each particular device configuration. Using conventional processes, for example, a mask used to form a device with a ×4 line configuration could not be used to form a device with a ×16 line configuration. The workpiece 100 fabricated according to the method shown above, however, provides a universal arrangement of conductive portions 142 on the workpiece 100. Accordingly, passages 150 can be selectively formed through the workpiece 100 in a desired arrangement corresponding to a desired line structure (e.g., ×4, ×8, ×16), after which the lines 170 can be constructed. One advantage of this method for fabricating interposer substrates is that the method is expected to significantly enhance the efficiency of the manufacturing process because a single substrate formed using a single mask can be configured for use with a variety of microfeature devices.

Figure 8:
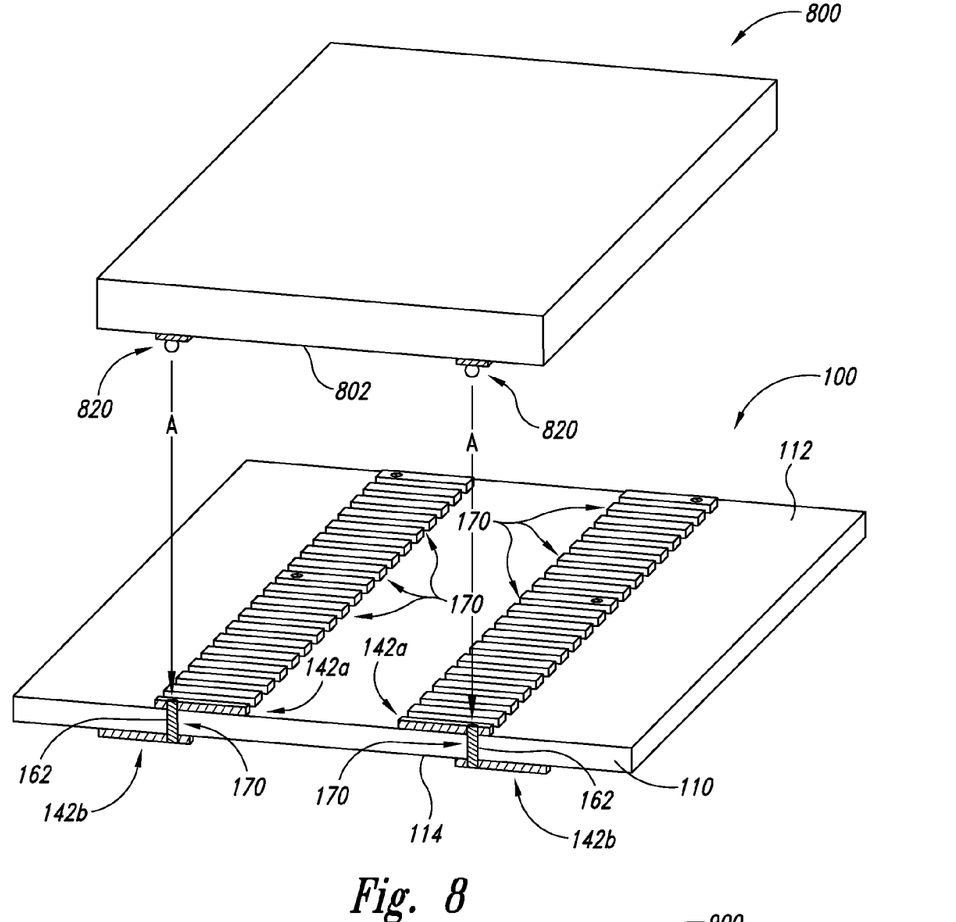
FIG. 8 is a cross-sectional isometric view of the interposer substrate of FIG. 7 after fabrication of the conductive structures and in position for attachment to a microelectronic die.

In several embodiments, a microelectronic die 800 can be attached to the corresponding lines 170 formed on the workpiece 100. Referring to FIG. 8, for example, the die 800 includes integrated circuitry (not shown) and a plurality of connectors 820 operably coupled to the integrated circuitry. The connectors 820 are positioned for attachment (shown by arrows A) to corresponding lines 170 on the workpiece 100. The die 800 shown in FIG. 8 can be electrically coupled to the workpiece in a flip chip (FCIP) process, wherein the contacts 820 at a front side 802 of the die 800 are electrically coupled to the lines 170 at the front side 112 of the substrate 110. In alternative embodiments, the die 800 may be connected to corresponding lines 170 on the workpiece 100 using other suitable methods, such as wire bonding and/or board-on-chip (BOC)/chip-on-board (COB) processes.

Additional Embodiments of Methods for Fabricating Conductive Structures

Figure 9:
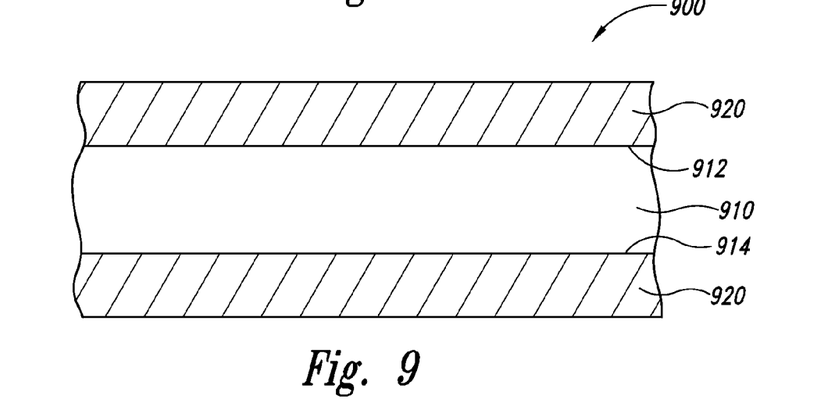

FIGS. 9-12B illustrate stages in another embodiment of a method for fabricating conductive structures on and/or in an interposing device in accordance with the invention. FIG. 9, more specifically, is a side cross-sectional view of a workpiece 900 including an interposer substrate 910 with a first side 912 and a second side 914 opposite the first side 912. The substrate 910 can be generally similar to the substrate 110 described above with respect to FIG. 1. The workpiece 900 further includes a conductive layer 920 deposited onto the first side 912 and the second side 914 of the substrate 910. The conductive layer 920 is generally composed of a metal, such as Cu, but in other embodiments the conductive layer 920 may be composed of other suitable materials.

Figure 10A:
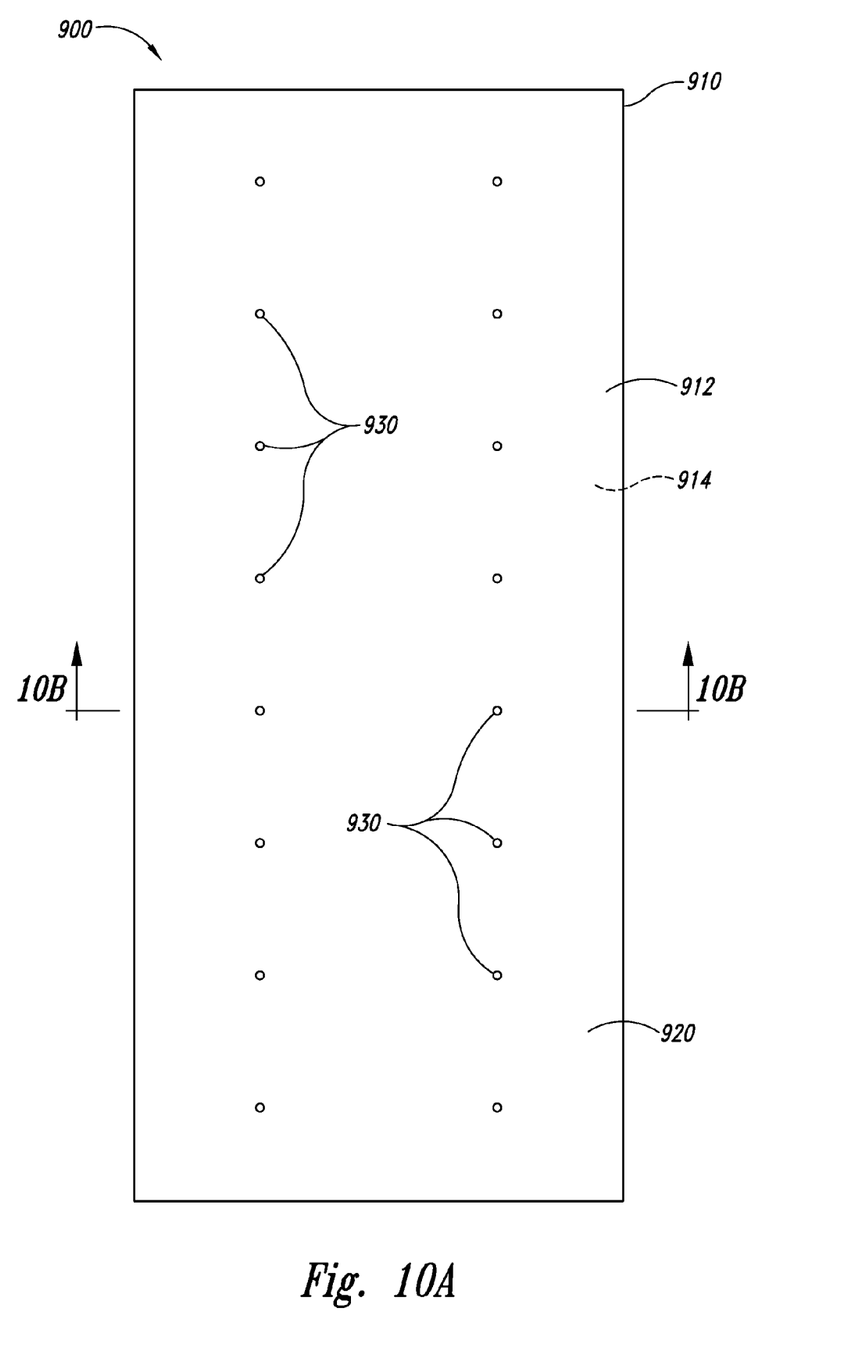
Figure 10B:
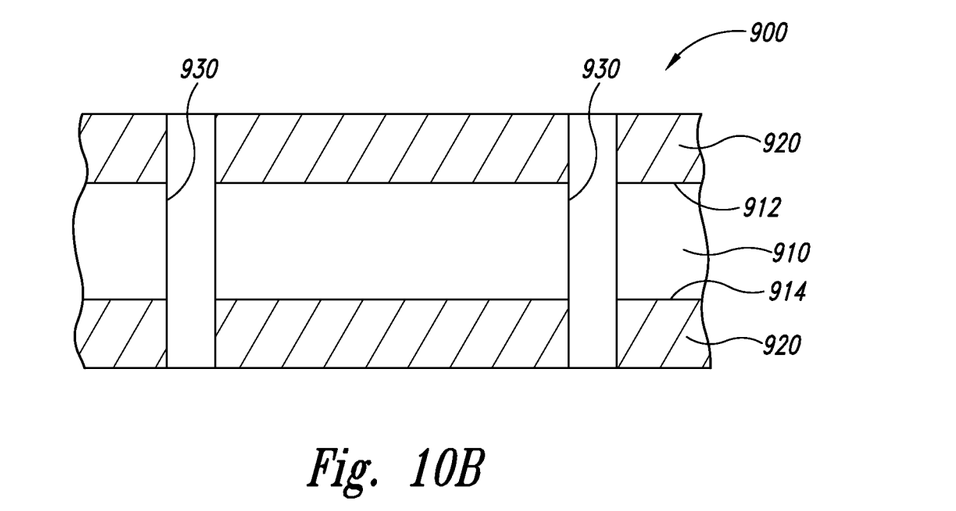

FIG. 10A is a top plan view of the workpiece 900 after selectively forming a plurality of passages 930 through the workpiece 900. FIG. 10B is a schematic side cross-sectional view taken substantially along line 10B-10B of FIG. 10A. Referring to FIGS. 10A and 10B together, the passages 930 extend completely through the substrate 910 and the first conductive layer 920 at both the first side 912 and the second side 914 of the substrate 910. The passages 930 are selectively formed in a pattern corresponding to a desired pattern of conductive elements to be formed on the workpiece 900. Although only sixteen passages 930 are shown extending through the workpiece 900 in FIGS. 10A and 10B, a different number of passages 930 may be formed through the workpiece 900 and/or the passages 930 cut through the workpiece 900 may have a different arrangement. The passages 930 can be formed using a drilling process as described above with respect to FIGS. 6A and 6B, a laser, a suitable etching process, and/or other suitable methods known to those of skill in the art.

Figure 11:
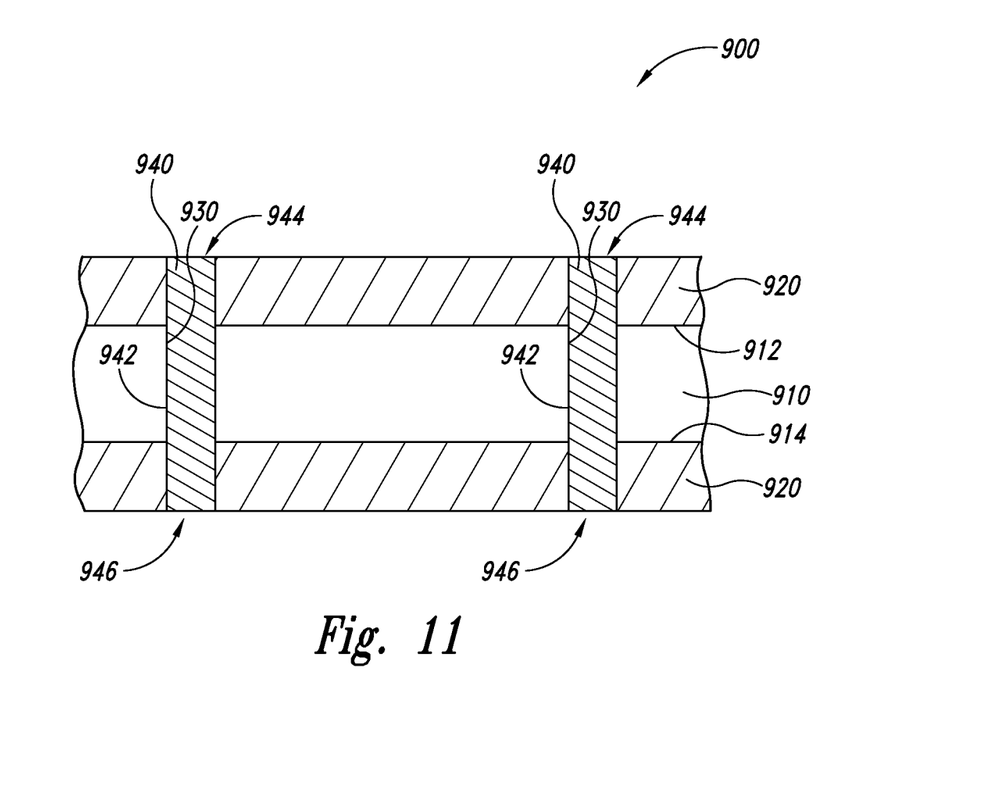

Referring next to FIG. 11, a conductive fill material 940 is deposited into the passages 930 to form interconnects 942 extending through the workpiece 900. The interconnects 942 include a first end 944 proximate the first side 912 of the substrate 910 and a second end 946 proximate the second side 914 of the substrate 910. The fill material 940 can be generally similar to the fill material 160 described above in FIG. 7 and can be deposited into the passages 930 using processes similar to those described previously.

Figure 12A:
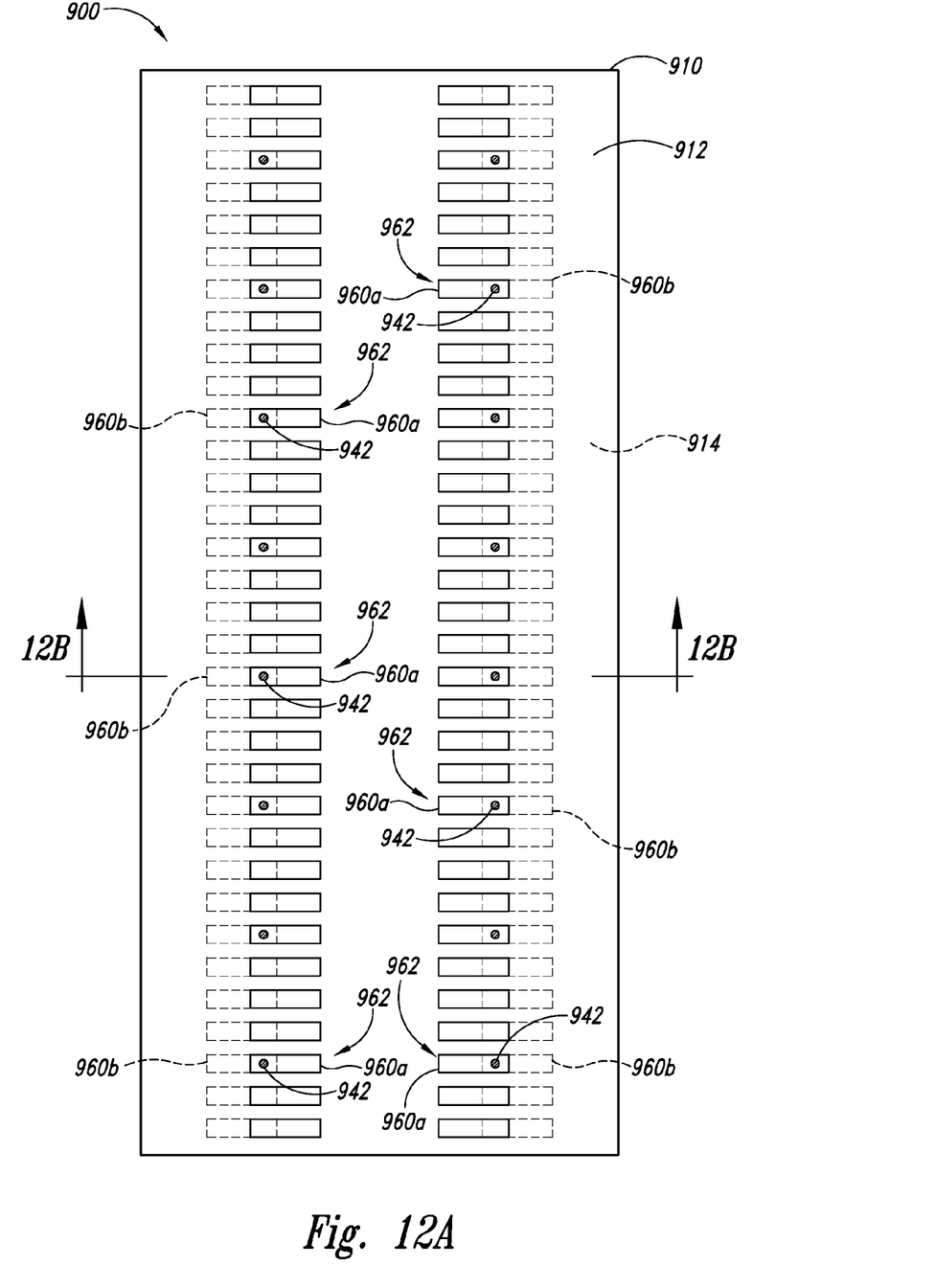
Figure 12B:
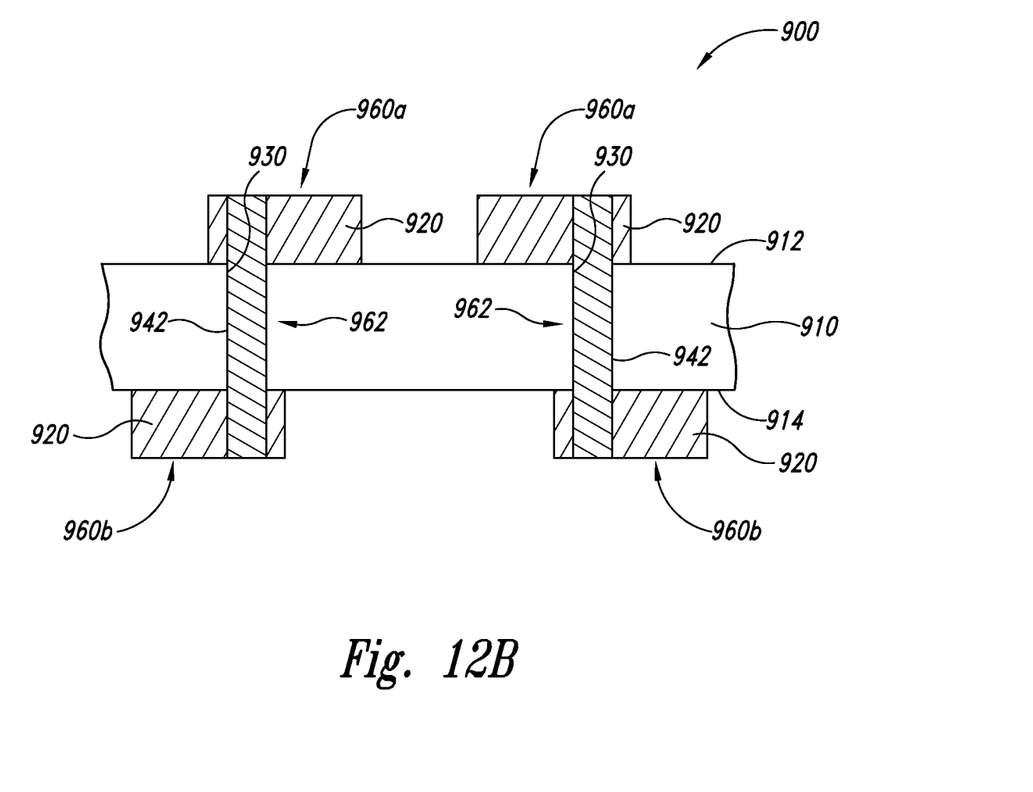

FIG. 12A is a top plan view of the workpiece 900 after selectively removing portions of the conductive layer 920 and FIG. 12B is a side cross-sectional view taken substantially along line 12B-12B of FIG. 12A. Referring to FIGS. 12A and 12B together, the first side 912 and the second side 914 of the substrate 910 are patterned and etched using a suitable etching process to form a plurality of conductive sections 960 on the workpiece 900. More specifically, a plurality of first conductive sections 960a are formed at the first side 912 of the substrate 910 and a plurality of second conductive sections 960b are formed at the second side 914 of the substrate 910. The first and second sections 960a and 960b are electrically coupled by the interconnects 942 extending through the substrate 910. Each first section 960a, second section 960b, and corresponding interconnect 942 together form a conductive line 962. The lines 962 on the workpiece 900 have a universal arrangement that can be adapted for use with a particular type of die. Accordingly, the number of interconnects 942 can be less than the number of lines 962 on the workpiece 900. After forming the plurality of lines 962 on the workpiece 900, a microelectronic die (not shown) can be coupled to the workpiece as described above with respect to FIG. 8. The workpiece 900 is expected to have many of the same advantages as those described previously.

From the foregoing, it will be appreciated that specific embodiments of the invention have been described herein for purposes of illustration, but that various modifications may be made without deviating from the spirit and scope of the invention. For example, various aspects of any of the foregoing embodiments can be combined in different combinations. Accordingly, the invention is not limited except as by the appended claims.

I claim:

1. A method for fabricating interposer devices having substrates, the method comprising:
   forming a plurality of conductive sections on a first side of a first interposer substrate in a first pattern;
   forming a plurality of conductive sections on a first side of a second interposer substrate in a second pattern different than the first pattern, wherein the second interposer substrate is separate and discrete from the first interposer substrate; and
   constructing a plurality of conductive lines on both the first interposer substrate and the second interposer substrate, wherein the first interposer substrate and the second interposer substrate have the same predetermined arrangement of conductive lines,
   wherein the plurality of conductive lines are formed either before or after forming the conductive sections in the first pattern and/or forming the conductive sections in the second pattern on the first and second interposer substrates, respectively,
   wherein the conductive lines at the first side of the first interposer substrate are positioned to be directly electrically coupled to corresponding connectors on a first microelectronic die to which the first interposer substrate will be attached, and
   wherein the conductive lines at the first side of the second interposer substrate are positioned to be directly electrically coupled to corresponding connectors on a second microelectronic die to which the second interposer substrate will be attached, wherein the first interposer substrate remains separate and discrete from the second interposer substrate before and after constructing the plurality of conductive lines.

2. The method of claim 1 wherein forming a plurality of conductive sections on a first interposer substrate in a first pattern comprises using a single photolithographic and etching process.

3. The method of claim 1 wherein forming a plurality of conductive sections on a second interposer substrate in a second pattern comprises using a single photolithographic and etching process.

4. The method of claim 1 wherein:
   forming a plurality of conductive sections on a first interposer substrate in a first pattern comprises using a single photolithographic and etching process; and
   forming a plurality of conductive sections on a second interposer substrate in a second pattern comprises using a single photolithographic and etching process.

5. The method of claim 1 wherein forming a plurality of conductive sections on a first interposer substrate in a first pattern comprises:
   depositing a seed layer onto the first side of the first interposer substrate and a second side of the first interposer substrate opposite the first side;
   forming a first pattern in a resist layer on the seed layer, the first pattern having an arrangement of apertures corresponding to a desired arrangement of openings in the resist layer;
   forming openings in the resist layer,
   depositing a conductive material into the openings to construct conductive sections on and/or in the first interposer substrate in the first pattern, wherein the individual conductive sections include a first section at the first side of the first interposer substrate and a second section at the second side of the first interposer substrate; and
   removing selected portions of the resist layer.

6. The method of claim 1 wherein forming a plurality of conductive sections on a second interposer substrate in a second pattern comprises:
   depositing a conductive material onto the first side of the second interposer substrate and a second side of the second interposer substrate opposite the first side; and
   removing selected portions of the conductive material after selectively forming passages through the conductive material and the second interposer substrate to form a plurality of conductive sections on and/or in the second interposer substrate in a second pattern, the individual conductive sections including a first section at the first side of the second interposer substrate and a second section at the second side of the second interposer substrate.

7. The method of claim 1 wherein forming a plurality of conductive sections on a first interposer substrate in a first pattern comprises:
   depositing a conductive material onto the first side of the first interposer substrate and a second side of the first interposer substrate opposite the first side; and
   removing selected portions of the conductive material after selectively forming passages through the conductive material and the first interposer substrate to form a plurality of conductive sections on and/or in the first interposer substrate in a first pattern, the individual conductive sections including a first section at the first side of the first interposer substrate and a second section at the second side of the first interposer substrate.

8. The method of claim 1 wherein forming a plurality of conductive sections on a second interposer substrate in a second pattern comprises:
   depositing a seed layer onto the first side of the second interposer substrate and a second side of the second interposer substrate opposite the first side;
   forming a second pattern in a resist layer on the seed layer, the second pattern having an arrangement of apertures corresponding to a desired arrangement of openings in the resist layer;
   forming openings in the resist layer,
   depositing a conductive material into the openings to construct conductive sections on and/or in the second interposer substrate in the second pattern, wherein the individual conductive sections include a first section at the first side of the second interposer substrate and a second section at the second side of the second interposer substrate; and removing selected portions of the resist layer.

9. The method of claim 1 wherein constructing conductive lines comprises:
selectively forming passages through the first interposer substrate and/or the second interposer substrate in a predetermined third pattern corresponding to a desired arrangement of conductive lines; and
depositing a conductive fill material into the individual passages to form interconnects extending through the first interposer substrate and/or the second interposer substrate.

10. The method of claim 9 wherein selectively forming passages through the first interposer substrate and/or the second interposer substrate comprises using a Computer Numerically Controlled (CNC) drilling process to form the passages.

11. The method of claim 9 wherein selectively forming passages through the first interposer substrate and/or the second interposer substrate comprises using a laser to form the passages.

12. The method of claim 9 wherein selectively forming passages through the first interposer substrate and/or the second interposer substrate comprises using a stamping process to form the passages.

13. The method of claim 1 wherein forming a plurality of conductive sections on a first interposer substrate in a first pattern comprises forming a plurality of first conductive sections at the first side of the first interposer substrate and a plurality of corresponding second conductive sections at a second side of the first interposer substrate.

14. The method of claim 1 wherein forming a plurality of conductive sections on a second interposer substrate in a second pattern comprises forming a plurality of first conductive sections at the first side of the second interposer substrate and a plurality of corresponding second conductive sections at a second side of the second interposer substrate.

15. The method of claim 1, wherein the connectors on the first microelectronic die or the second microelectronic die being arranged in a fourth pattern corresponding to the predetermined arrangement of the conductive lines on the first interposer substrate or the second interposer substrate, respectively.

16. A method for fabricating an interposer device for connection to a microelectronic die, the die including integrated circuitry and connectors operatively coupled to the integrated circuitry, the connectors having a first pattern on the die, the method comprising:
forming a conductive layer having a second pattern on and/or in an interposer substrate;
selectively forming passages through the substrate either before or after forming the conductive layer on and/or in the substrate, the passages being formed in a third pattern corresponding to a predetermined arrangement of conductive lines on the substrate, wherein the third pattern is generally similar to the first pattern; and
constructing conductive lines on and/or in the substrate by selectively electrically coupling first conductive sections of the conductive layer at a first side of the substrate to second conductive sections of the conductive layer at a second side of the substrate, wherein at least some of the first conductive sections and the second conductive sections do not include passages.

17. The method of claim 16, further comprising electrically coupling the connectors on the die to corresponding conductive lines on the substrate.

18. The method of claim 16 wherein forming a conductive layer having a second pattern on and/or in an interposer substrate comprises:
depositing a seed layer onto a first side of the substrate and a second side of the substrate opposite the first side;
forming the second pattern in a resist layer on the seed layer, the second pattern having an arrangement of apertures corresponding to a desired arrangement of openings over the resist layer;
forming openings in the resist layer,
depositing a conductive material into the openings to construct conductive sections on and/or in the substrate; and
removing selected portions of the resist layer.

19. The method of claim 16 wherein forming a conductive layer having a second pattern on and/or in an interposer substrate comprises depositing a conductive material onto a first side of the substrate and a second side of the substrate opposite the first side, and wherein the method further comprises:
removing selected portions of the conductive material after selectively forming the passages though the substrate to form the first conductive sections at the first side of the substrate and the second conductive sections at the second side; and
depositing a conductive fill material into the individual passages to form interconnects extending through the substrate and electrically coupling first sections to corresponding second sections.

20. The method of claim 16 wherein constructing conductive lines on and/or in an interposer substrate comprises depositing a conductive fill material into the individual passages to form interconnects extending through the substrate and electrically coupling the first sections to corresponding second sections.

* * * * *